US008949652B2

(12) United States Patent
Lee

(10) Patent No.: US 8,949,652 B2
(45) Date of Patent: Feb. 3, 2015

(54) GLITCHLESS PROGRAMMABLE CLOCK SHAPER

(75) Inventor: Chi Keung Lee, San Jose, CA (US)

(73) Assignee: Nvidia Corporation, Santa Clara, CA (US)

(*) Notice: Subject to any disclaimer, the term of this patent is extended or adjusted under 35 U.S.C. 154(b) by 472 days.

(21) Appl. No.: 13/288,804

(22) Filed: Nov. 3, 2011

(65) Prior Publication Data

US 2013/0117598 A1 May 9, 2013

(51) Int. Cl.
G06F 1/04 (2006.01)
H03K 5/13 (2014.01)

(52) U.S. Cl.
CPC .................................... *H03K 5/131* (2013.01)
USPC ............................. 713/503; 713/400; 713/600

(58) Field of Classification Search
CPC ........................................................ G06F 1/10
USPC .................... 713/400, 401, 500, 600, 503
See application file for complete search history.

(56) References Cited

U.S. PATENT DOCUMENTS

| | | | | |
|---|---|---|---|---|
| 5,467,464 A | * | 11/1995 | Oprescu et al. | 713/400 |
| 5,706,484 A | * | 1/1998 | Mozdzen et al. | 713/400 |
| 6,073,246 A | * | 6/2000 | Song et al. | 713/401 |
| 6,158,030 A | * | 12/2000 | Reichle et al. | 714/724 |
| 6,192,092 B1 | * | 2/2001 | Dizon et al. | 375/371 |
| 6,430,725 B1 | * | 8/2002 | Reichle et al. | 714/815 |
| 6,446,180 B2 | * | 9/2002 | Li et al. | 711/167 |
| 6,629,255 B1 | * | 9/2003 | Barkatullah et al. | 713/500 |
| 6,754,861 B2 | * | 6/2004 | Reichle et al. | 714/724 |
| 6,792,554 B2 | * | 9/2004 | Gervais et al. | 713/600 |
| 6,889,336 B2 | * | 5/2005 | Schoenfeld et al. | 713/503 |
| 7,199,629 B2 | * | 4/2007 | Minzoni | 327/158 |
| 7,243,253 B1 | * | 7/2007 | McClary et al. | 713/500 |
| 7,272,742 B2 | * | 9/2007 | Schoenfeld et al. | 713/503 |
| 7,765,425 B1 | * | 7/2010 | Searles et al. | 713/503 |

OTHER PUBLICATIONS

Cypress Semiconductor Corporation. CY7B9910/CY7B9920 Low Skew Clock Buffer. Jul. 7, 1997.*
Kim et al. Digit-Serial Multiplier Design Using Skew-Tolerant Domino Circuits. IEEE. 2001.*
IDT. Low Skew 1 to 4 Clock Buffer. Datasheet. 2006.*

* cited by examiner

*Primary Examiner* — Matthew David

(57) ABSTRACT

In one embodiment, a microprocessor includes one or more processing cores. At least one processing core includes a clock shaping circuit that is configured to receive a clock input signal. The clock shaping circuit includes rising edge skew logic that is configured to selectively delay a rising edge of the clock input signal and falling edge skew logic that is configured to selectively delay a falling edge of the clock input signal independent of adjustment of the rising edge.

20 Claims, 9 Drawing Sheets

GLITCHLESS PROGRAMMABLE CLOCK SHAPER

BACKGROUND

Typically in a computing system, a clock signal is used to define a time reference for synchronizing operations and movement of data between components. A clock distribution network distributes the clock signal from a common point to various components throughout the computing system. Programmable delay lines and various circuits that modify the clock signal may be employed throughout the clock distribution network to insert clock delays and otherwise modify the clock signal to match timing between different components.

As one example, a clock trimmer circuit 100 that may be employed in a computing system is shown in FIG. 1. The clock trimmer circuit 100 is programmable based on a trim value (TRIM_VALUE) 102 that is applied to a clock input signal (CKIN) 104 to change an amount of delay that is applied to the clock input signal 104. The delay is varied using a cascade of 2-input inverting multiplexers 106. In particular, a first multiplexer in the cascade of multiplexers 106 receives the clock input signal 104 as each of the two inputs. Each of the following multiplexers in the cascade of multiplexers 106 receives the output of the previous multiplexer as one input and the clock input signal 104 as the other input. The trim value 102 is decoded by a decoder 108 to provide a select signal for each of the multiplexers in the cascade of multiplexers 106. The decoded trim value controls which multiplexers select the cascaded clock value that is passed from one multiplexer to the next in the cascade of multiplexers 106, so as to control the amount of delay that is applied to the clock input signal 104. A clock output signal (CKOUT) 110 that is output from the clock trimmer circuit 100 is skewed relative to the clock input signal 104 by the amount of delay that is applied through the cascade of multiplexers 106. Inverting multiplexers are implemented to reduce a delay-step size between multiplexers for finer granularity control. In some cases, the delayed clock signal may be inverted, and the polarity of the delayed clock signal is corrected by a final multiplexer in the cascade of multiplexers 106 before being output.

There are various issues and limitations associated with this approach. For example, the clock trimmer circuit 100 is only configured to add delay to both the rising edge and the falling edge of the clock input signal 104 in lock-step so that the duty cycle is fixed. In other words, the rising edge and the falling edge of the clock input signal are not independently programmable. This feature results in an overall reduction in performance speed of the computing system, since under some conditions the clock frequency is slowed by the lock-step delay.

DETAILED DESCRIPTION

The present discussion sets forth novel microprocessor architectures and methods for dynamically shaping a clock signal without generating glitches in what may be referred to as "glitchless" clock shaping. More particularly, the present discussion relates to a clock shaping circuit that is configured to adjust a rising edge and/or a falling edge of a clock signal path independently. In other words, the clock shaping circuit is configured to selectively adjust a rising edge delay, a falling edge delay, or a rising edge delay and a falling edge delay of a clock signal. The programmable clock shaping circuit enables real-time re-programming of a clock signal without stopping operation of a clock source. Such independent signal shaping functionality may be advantageously employed for debugging clock signal paths in a circuit subsequent to silicon production (i.e., after tape-out) to increase computing system speed, efficiency, and performance.

Figure 1:
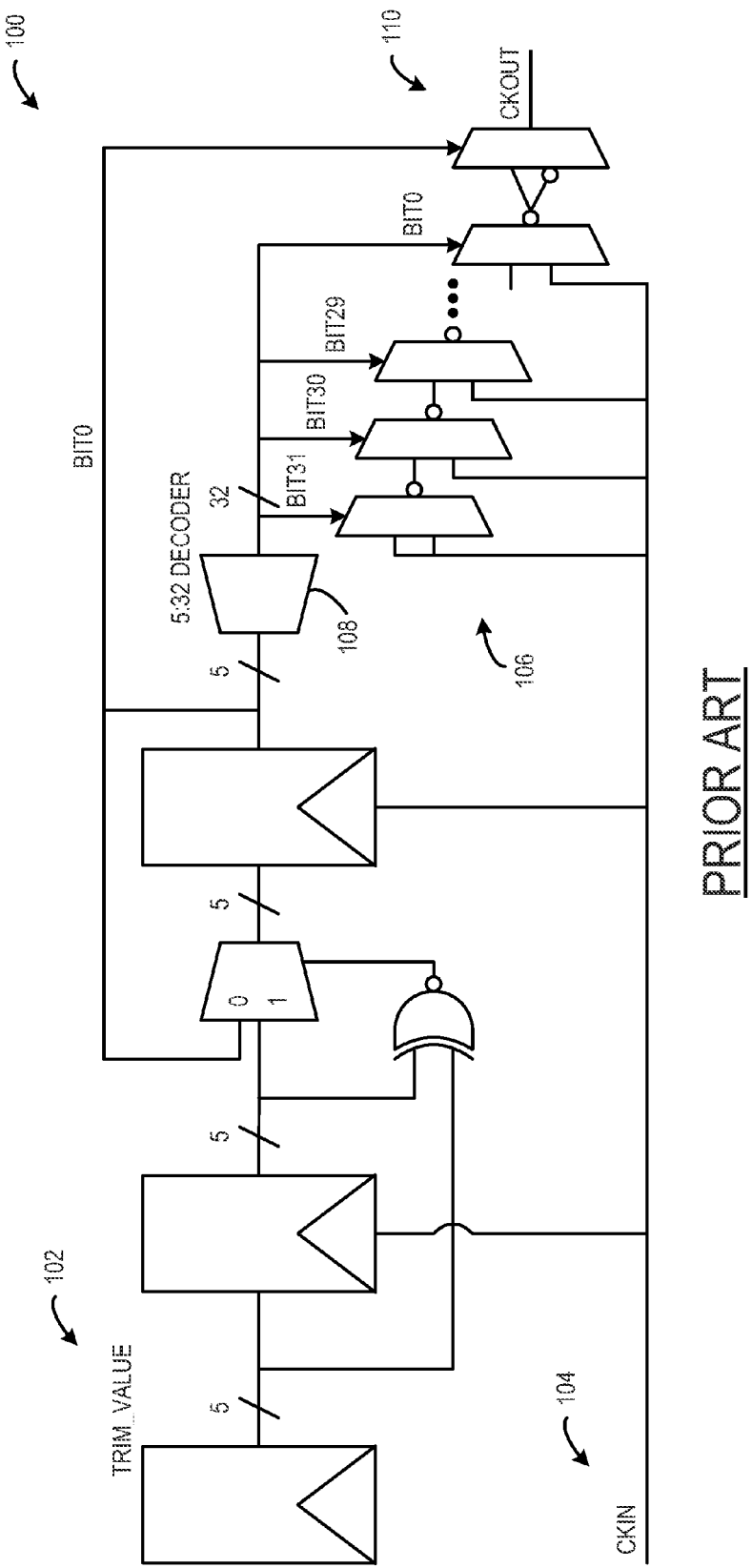
FIG. 1 schematically shows a PRIOR ART clock trimmer circuit.
Figure 2:
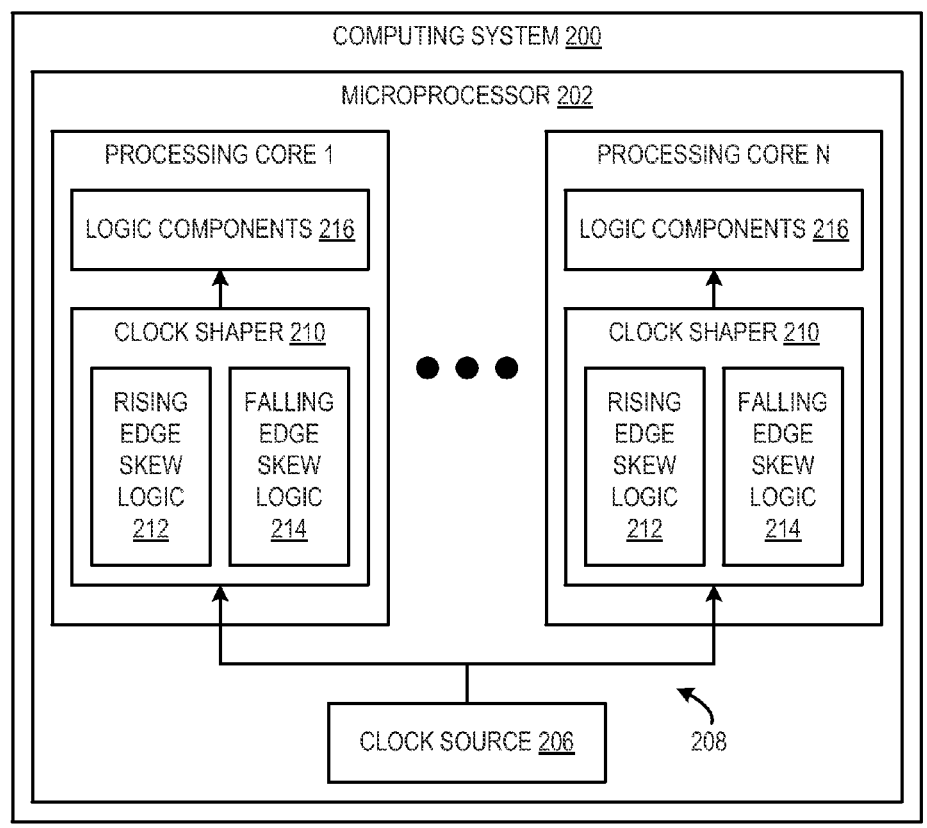
FIG. 2 schematically shows an embodiment of a computing system.

FIG. 2 schematically shows an embodiment of a computing system 200. The computing system 200 includes a microprocessor 202. In the illustrated embodiment, the microprocessor 202 is a multi-core microprocessor that includes a plurality of processing cores. However, in some embodiments, the microprocessor 202 may include only a single processing core. A clock source 206 is configured to generate a clock signal that defines a time reference to synchronize the movement of data within the computing system 202. A clock distribution network 208 (e.g., a clock tree) distributes the clock signal from the clock source 206 to each of the plurality of processing cores 204. In the illustrated embodiment, each of the plurality of processing cores includes a clock shaping circuit 210. In some embodiments, one or more of the plurality of processing cores 204 may include more than one clock shaping circuit. In some embodiments, one or more of the plurality of processing cores 204 may not include a clock shaping circuit. For example, in some embodiments, a clock shaping circuit may be positioned in the clock distribution network 208 between the clock source 206 and the plurality of processing cores 204 to provide a clock signal to more than one processing core. Note that the use of the clock shaping circuit in the microprocessor is merely one example, and it will be appreciated that a clock shaping circuit may be utilized in any digital chip that has a clock signal (e.g., a digital signal processing chip, a memory module, etc.). Moreover, it will be appreciated that any suitable number of clock shaping circuits may be implemented in a digital chip.

The clock shaping circuit 210 is configured to receive a clock input signal that originates at the clock source 206. The clock shaping circuit 210 includes rising edge skew logic 212 and falling edge skew logic 214. The rising edge skew logic 212 is configured to selectively delay a rising edge of the clock input signal. The falling edge skew logic 214 is configured to selectively delay a falling edge of the clock input signal independent of adjustment of the rising edge. The clock shaping circuit 210 is configured to output a clock output signal that is selectively skewed relative to the clock input signal.

The clock shaping circuit 210 is configured to skew the clock output signal relative to the clock input signal differently depending on operating conditions. In some cases, the clock shaping circuit 210 skews the clock output signal relative to the clock input signal by adding an amount of rise delay to the rising edge of the clock input signal via the rising edge skew logic 212. For example, it may be determined during post-silicon debug that a processing operation may take less time in actuality to be completed than expected from design of the microprocessor 202. Since the processing operation takes less time than expected, the clock shaping circuit 210 can dynamically delay the rising edge of the clock signal to shorten the duty cycle of the clock signal. The delay adjustments made to shorten the duty cycle may increase the performance of the speed path of the clock signal. Further, in some implementations, the time remaining after completion of the processing operation may be borrowed for other operations, such as for different pipeline stages and/or between phases, etc.

In some cases, the clock shaping circuit 210 skews the clock output signal relative to the clock input signal by adding an amount of fall delay to the falling edge of the clock input signal via the falling edge skew logic 214. For example, it may be determined during post-silicon debug that a processing operation may take more time in actuality to be completed than expected from design of the microprocessor 202. Since the processing operation takes more time than expected, the clock shaping circuit 210 can dynamically delay the falling edge of the clock signal to lengthen the duty cycle of the clock signal to allow for the operation to be completed within the clock cycle. The delay adjustments made to lengthen the duty cycle may reduce uncertainty in the speed path of the clock signal and make the microprocessor more robust.

In some cases, the clock shaping circuit 210 skews the clock output signal relative to the clock input signal by adding an amount of rise delay to the rising edge of the clock input signal via the rising edge skew logic 212 and adding an amount of fall delay to the falling edge of the clock input signal via the falling edge skew logic 214. For example, the clock shaping circuit 210 may skew the clock input signal by adding delay to both the rising edge and the falling edge of the clock signal in order to match a clock insertion delay between two or more of the plurality of processing cores 204.

In some cases, the clock shaping circuit 210 does not skew the clock output signal relative to the clock input signal. In other words, in some cases, the clock shaping circuit 210 adds no substantial rise delay to the rising edge or fall delay to the falling edge of the clock input signal or the delay is substantially zero.

As alluded to above, it will be appreciated that the clock shaping circuit 210 may be employed to modify a clock signal of the microprocessor 202 in any suitable manner. In some implementations, the clock shaping circuit may be employed to statically match a clock insertion delay between two processing cores. In some implementations, the clock shaping circuit may be employed as part of a local clock tree to match timing between logic components 216. Note that the clock shaping circuit may be employed in any type of digital chip that has a clock signal to modify the clock signal as desired without departing from the scope of the present disclosure.

Logic components 216 may include any suitable component that performs a processing operation or is associated with a processing operation that operates based on the clock signal. For example, logic components 216 may include various components located in fetch, decode, and execution (and memory and write back in some cases) stages of a processing pipeline.

Furthermore, the clock shaping circuit 210 is configured to dynamically vary the amount of rise delay that is added to the rising edge of the clock signal and dynamically vary the amount of fall delay that is added to the falling edge of the clock signal. Such delays may be varied based on different processing operations and corresponding completion times, delay matching between different processing cores, etc.

Figure 3:
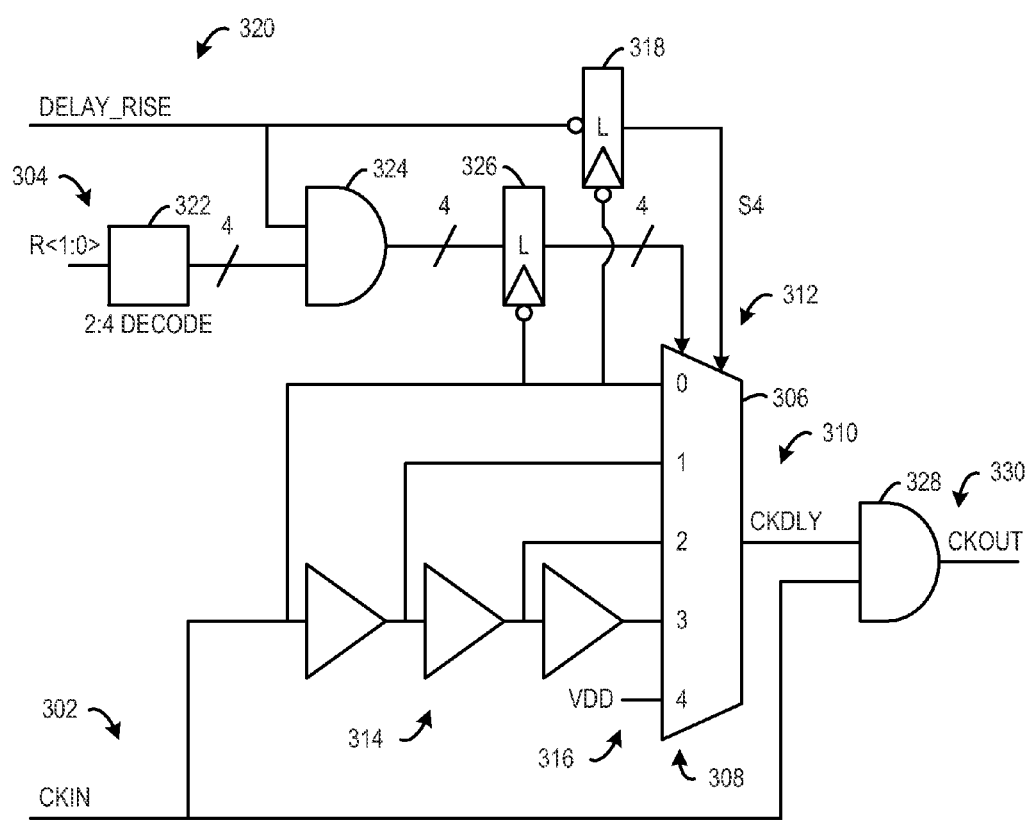
FIG. 3 schematically shows an embodiment of rising edge skew logic.

FIG. 3 schematically shows an embodiment of rising edge skew logic 212 that is implemented in the clock shaping circuit 210 shown in FIG. 2. The rising edge skew logic 212 is configured to selectively delay a rising edge of a clock input signal (CKIN) 302. A plurality of buffers 314 are coupled in series to produce different amounts of delay that may be applied to the rising edge of the clock input signal 302. A first buffer of the plurality of buffers 314 is configured to receive the clock input signal 302, the first buffer outputs the clock input signal 302 to an input of the next buffer in the series, and so on. Since the buffers are coupled in series, each buffer adds a delay step that is added to the delay step of the previous buffer in the series.

A multiplexer 306 is used to select the amount of delay that is applied to the rising edge of the clock input signal 302. The multiplexer 306 includes a plurality of input lines 308, an output line 310, and a select line 312. Note that depending on the embodiment the select line 312 may include a plurality of lines or may include a multiple bit line. In the illustrated embodiment, the select line 312 is shown as a 1-bit enable line and a 4-bit select line. Each output of the plurality of buffers 314 is coupled to an associated input line of the multiplexer 306. Additionally, the clock input signal 302 is directly coupled to one of the input lines of the multiplexer 306, and a power supply (VDD) 316 is coupled to another input line of the multiplexer 306. The multiplexer 306 is configured to select one of the plurality of input lines 308 to send to the output line 310 based on the state of the select line 312.

The select line 312 is configured to receive a delay rise enable signal (DELAY_RISE) 320 that is configured to activate or deactivate the delay function and a clock delay signal 304 that is configured to select the amount of rise delay that is passed to the output line 310. The delay rise enable signal 320 is sent to a latch 318 that is coupled to the select line 312. The latch 318 is configured to receive the delay rise enable signal 320, setup the delay rise enable signal 320 before the clock input signal 302 rises, and hold the delay rise enable signal 320 until the clock input signal 302 falls.

The clock delay signal 304 is received by a decoder 322. The decoder 322 outputs a decoded clock delay signal that is sent as an input to an AND gate 324 along with the delay rise enable signal 320. The output of the AND gate 324 is sent to a latch 326 that is coupled to the select line 312. The latch 326 is configured to receive the clock delay signal 304, setup the clock delay signal 304 before the clock input signal 302 rises, and hold the clock delay signal 304 until the clock input signal 302 falls. By latching the signals, no switching of the signals occur during selection by the multiplexer 306. Accordingly, glitches output from the multiplexer 306 may be eliminated.

The clock delay signal 304 and the delay rise enable signal 320 are used in conjunction to vary the amount of rise delay that is applied to the rising edge of the clock input signal 302. In particular, the state of the delay rise enable signal 320 determines whether or not rise delay is applied to the rising edge of the clock input signal 302. For example, in the illustrated embodiment, when the delay rise enable signal 320 is zero, then input line 4 (VDD) of the multiplexer 306 is selected, and the output line 310 is set to VDD (i.e., power), and the rising edge of the clock input signal 302 is not delayed. In other words, by forcing the output line 310 to VDD the multiplexer 306 may be bypassed so that no delay is added to the rising edge of the clock input signal 302. In some embodiments, the clock delay signal 304 and the delay rise enable signal 320 may be combined into one signal that enables the multiplexer 306 and controls input selection.

On the other hand, if the delay rise enable signal 320 is one, then the delay function is activated, and an amount of delay is selected based on the clock delay signal 304. In the illustrated embodiment, the clock delay signal 304 may determine selection between four different delay steps including (1) an amount of delay for the clock input signal 302 to pass through the multiplexer 306; (2) an amount of delay for the clock input signal 302 to pass through one buffer and the multiplexer 306; (3) an amount of delay for the clock input signal 302 to pass through two buffers and the multiplexer 306; and (4) an amount of delay for the clock input signal 302 to pass through the three buffers and the multiplexer 306. It will be appreciated that any suitable number of steps and step size may be employed without departing from the scope of the present disclosure.

The selected clock delay (CKDLY) is provided to the output line 310 of the multiplexer 306. The selected clock delay is sent as an input to an AND gate 328 along with the clock input signal 302. A clock output signal (CKOUT) 330 is output from the AND gate 328. The clock output signal 330 is selectively skewed relative to the clock input signal 302 such that the rising edge includes an amount of rise delay when the delay rise enable signal 320 activates the delay function of the rising edge skew logic 212. This configuration enables an amount of rise delay that is applied to the clock input signal 302 to be dynamically varied according to the plurality of buffers 314.

Note the above described embodiment is merely exemplary, and it should be appreciated that other configurations may be implemented without departing from the scope of the present disclosure. For example, the multiplexer 306 may have a different number of inputs such that there are more or less than four different amounts of delay that are selectable to apply to the rising edge.

Figure 4:
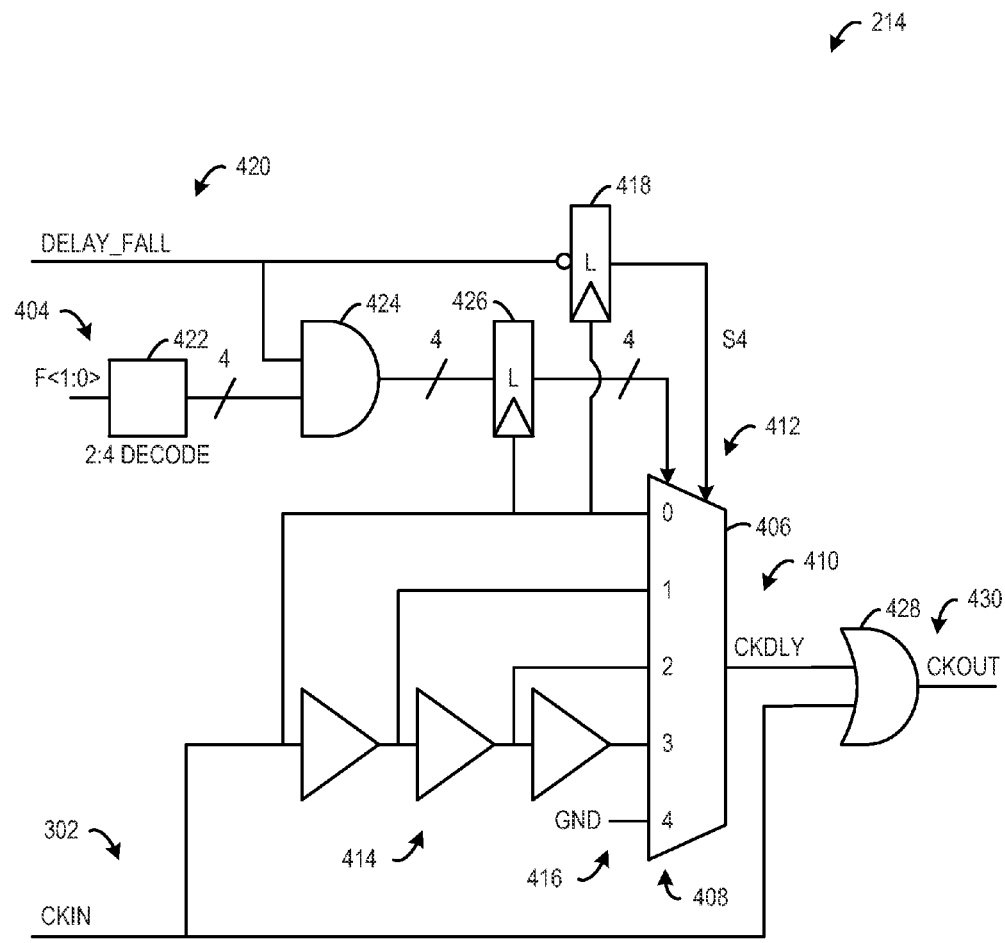
FIG. 4 schematically shows an embodiment of falling edge skew logic.

FIG. 4 schematically shows an embodiment of falling edge skew logic 214 that is implemented in the clock shaping circuit 210 shown in FIG. 2. The falling edge skew logic 214 is configured to selectively delay a falling edge of the clock input signal (CKIN) 302. A plurality of buffers 414 are coupled in series to produce different amounts of delay that may be applied to the falling edge of the clock input signal 302. A first buffer of the plurality of buffers 414 is configured to receive the clock input signal 302, the first buffer outputs the clock input signal 302 to an input of the next buffer in the series, and so on. Since the buffers are coupled in series, each buffer adds a delay step that is added to the delay step of the previous buffer in the series.

A multiplexer 406 is used to select the amount of delay that is applied to the falling edge of the clock input signal 302. The multiplexer 406 includes a plurality of input lines 408, an output line 410, and a select line 412. Each output of the plurality of buffers 414 is coupled to an associated input line of the multiplexer 406. Additionally, the clock input signal 302 is directly coupled to one of the input lines of the multiplexer 406, and ground (GND) 416 is coupled to another input line of the multiplexer 406. The multiplexer 406 is configured to select one of the plurality of input lines 408 to send to the output line 410 based on the state of the select line 412.

The select line 412 is configured to receive a delay fall enable signal (DELAY_FALL) 420 that is configured to activate or deactivate the delay function and a clock delay signal 404 that is configured to select the amount of fall delay that is passed to the output line 410. The delay fall enable signal 420 is sent to a latch 418 that is coupled to the select line 412. The latch 418 is configured to receive the delay fall enable signal 420, setup the delay fall enable signal 420 before the clock input signal 302 rises, and hold the delay fall enable signal 420 until the clock input signal 302 falls. Note in some embodiments, latches 418 and 426 are high phase latches.

The clock delay signal 404 is received by a decoder 422. The decoder 422 outputs a decoded clock delay signal that is sent as an input to an AND gate 424 along with the delay fall enable signal 420. The output of the AND gate 424 is sent to a latch 426 that is coupled to the select line 412. The latch 426 is configured to receive the clock delay signal 404, setup the clock delay 404 before the clock input signal 302 falls, and hold the clock delay signal 404 until the clock input 302 rises. By latching the clock delay signal 404 and the delay fall enable signal 420, no switching of the signals occurs during selection by the multiplexer 406. Accordingly, glitches output from the multiplexer 406 may be eliminated.

The clock delay signal 404 and the delay fall enable signal 420 are used in conjunction to vary the amount of fall delay that is applied to the falling edge of the clock input signal 302. In particular, the state of the delay fall enable signal 420 determines whether or not fall delay is applied to the falling edge of the clock input signal 302. For example, in the illustrated embodiment, when the delay fall enable signal 420 is zero, then input line 4 (GND) of the multiplexer 406 is selected, and the output line 410 is set to GND (i.e., ground), and the falling edge of the clock input signal 302 is not delayed. In other words, by forcing the output line 410 to GND the multiplexer 406 may be bypassed so that no delay is added to the falling edge of the clock input signal 302.

On the other hand, if the delay fall enable signal 420 is one, then the delay function is activated, and an amount of delay is selected based on the clock delay signal 404. In the illustrated embodiment, the clock delay signal 404 may determine selection between four different delay steps including (1) an amount of delay for the clock input signal 302 to pass through the multiplexer 406; (2) an amount of delay for the clock input signal 302 to pass through one buffer and the multiplexer 406; (3) an amount of delay for the clock input signal 302 to pass through two buffers and the multiplexer 406; and (4) an amount of delay for the clock input signal clock 302 to pass through the three buffers and the multiplexer 406.

The selected clock delay (CKDLY) is provided to the output line 410 of the multiplexer 406. The selected clock delay is sent as an input to an OR gate 428 along with the clock input signal 302. A clock output signal (CKOUT) 430 is output from the OR gate 428. The clock output signal 430 is selectively skewed relative to the clock input signal 302 such that the falling edge includes an amount of fall delay when the delay fall enable signal 420 activates the delay function of the falling edge skew logic 214. This configuration enables an amount of fall delay that is applied to the clock input signal 302 to be dynamically varied according to the plurality of buffers 414.

Note the above described embodiment is merely exemplary, and it should be appreciated that other configurations may be implemented without departing from the scope of the present disclosure. For example, the multiplexer 406 may have a different number of inputs such that there are more or less than four different amounts of delay that are selectable to apply to the falling edge.

Figure 5:
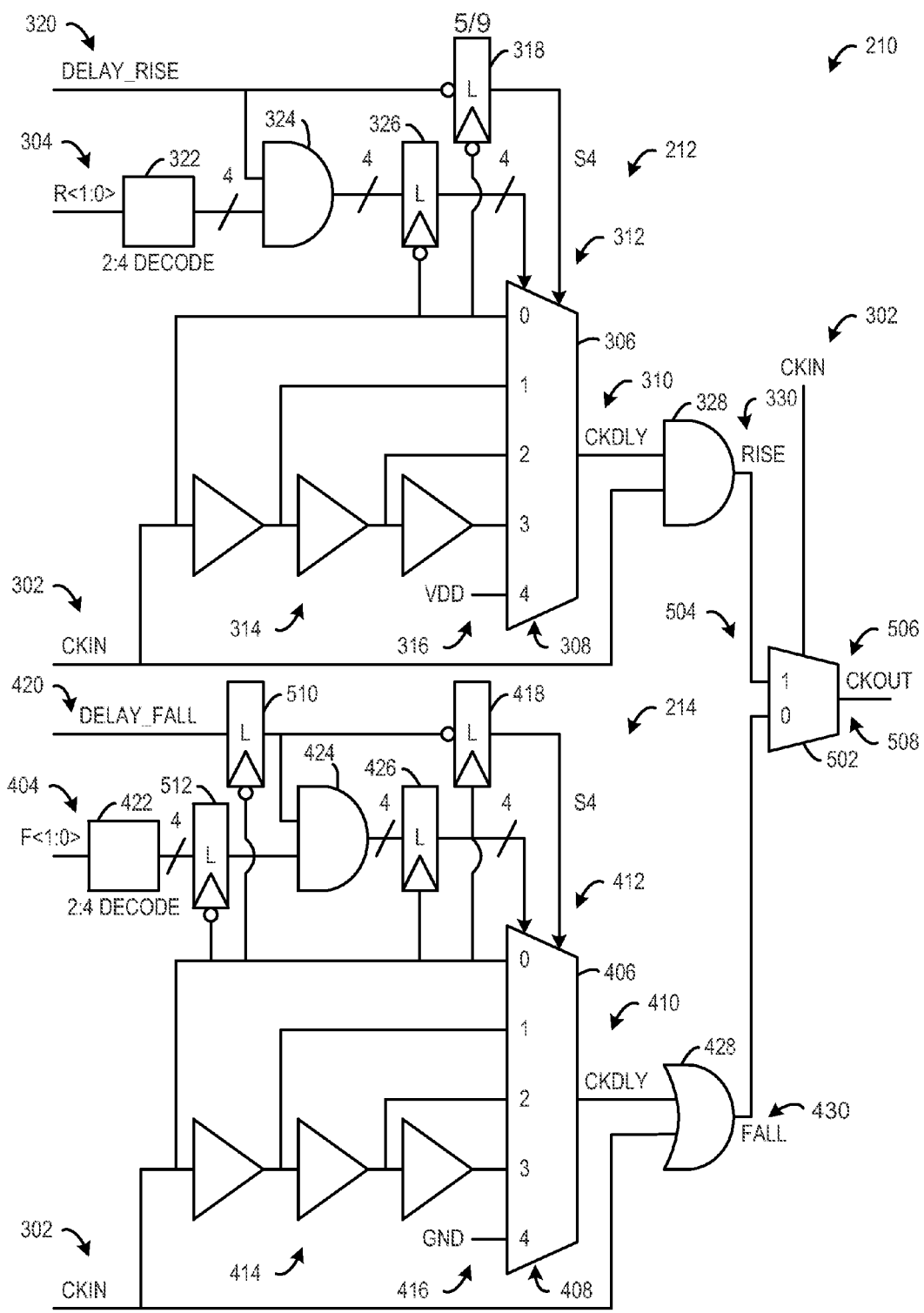
FIG. 5 schematically shows an embodiment of a clock shaping circuit.

FIG. 5 schematically shows an embodiment of the clock shaping circuit 210. The clock shaping circuit 210 combines the rising edge skew logic 212 shown in FIG. 3 and the falling edge skew logic 214 shown in FIG. 4 to selectively skew the a clock output signal (CKOUT) 508 relative to the clock input signal 302. The rising edge skew logic 212 and the falling edge skew logic 214 receive the clock input signal 302 in parallel and operate at the same time.

The clock shaping circuit 210 includes a multiplexer 502 including input lines 504, an output line 506, and a select line 508. The input lines 504 of the multiplexer 502 are configured to receive a clock output signal (RISE) 330 that is output by the rising edge skew logic 212 and a clock output signal (FALL) 430 that is output by the falling edge skew logic 214. The select line 508 is configured to receive the clock input signal (CKIN) 302. When the clock input signal 302 is high (e.g., one), the multiplexer 502 selects the clock output signal 330 output by the rising edge skew logic 212 to pass to the output line 506. When the clock input signal 302 is low (e.g., zero), the multiplexer 502 selects the clock output signal 430 output by the falling edge skew logic 214 to pass to the output line 506.

Furthermore, the clock shaping circuit 210 includes latches 510 and 512. The latch 510 is configured to receive the delay fall enable signal 420, setup the delay fall enable signal 420 before the clock input signal 302 rises, and hold the delay fall enable signal 420 until the clock input signal 302 falls. The latch 512 is configured to receive the clock delay signal 404, setup the clock delay 404 before the clock input signal 302 falls, and hold the clock delay signal 404 until the clock input 302 rises. The signals are latched in order to prevent glitches during rise and fall of the clock input signal 302.

In this configuration, the output of the rising edge skew logic 212 and the output of the falling edge skew logic 214 propagate more slowly than the clock input signal 302 is received by the select line 508 of the multiplexer 502, and the transition of the outputs of the rising edge skew logic 212 and the falling edge skew logic 214 are monotonic. Accordingly, the clock output signal 508 of the clock shaping circuit 210 is glitchless.

Moreover, since the rising edge skew logic 212 is configured to dynamically vary the amount of rise delay applied to the clock input signal 302, and the falling edge skew logic 214 is configured to dynamically vary the amount of fall delay that is applied to the clock input signal 302 independent of adjustment of the rising edge, the clock shaping circuit 210 can be used to shape the clock input signal as well or trim the clock input signal for different applications. For example, the clock shaping circuit 210 may delay either the rising edge or the falling edge in speed path debug applications. In another example, the clock shaping circuit 210 may delay both the rising edge and the falling edge in clock trimming applications.

Figure 6:
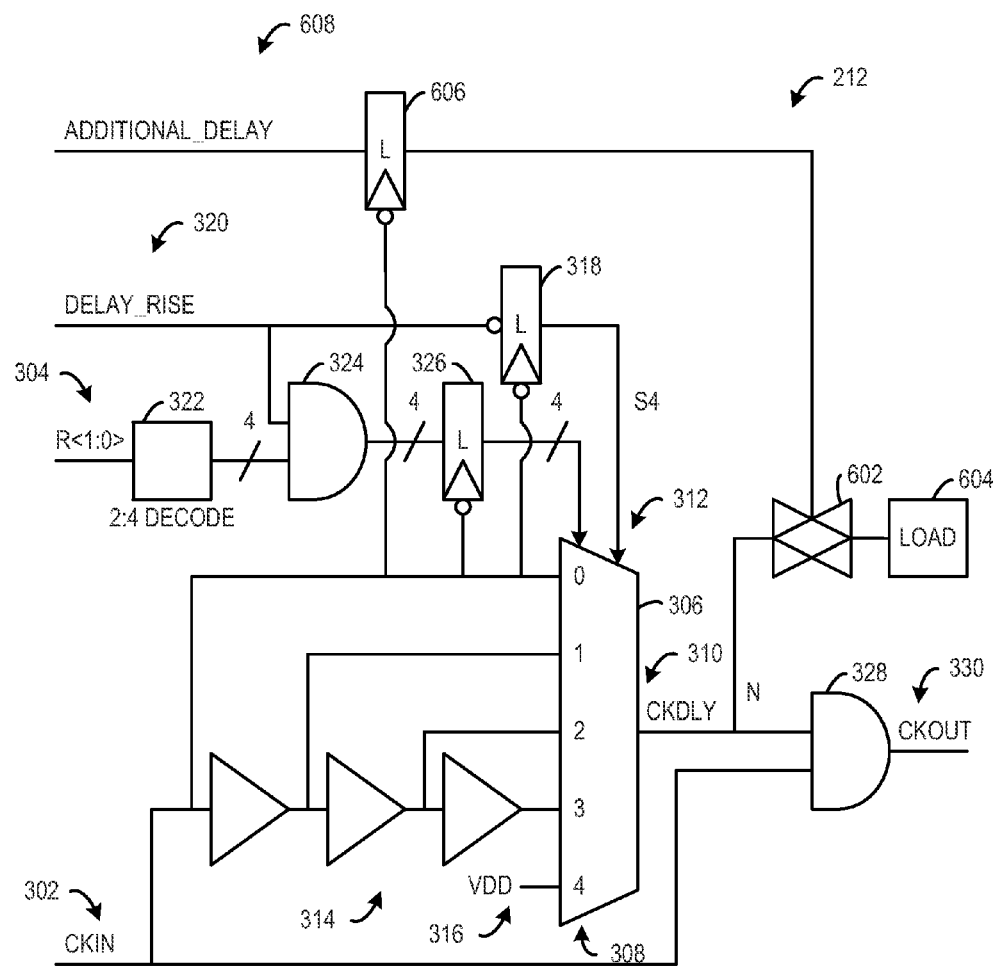
FIG. 6 schematically shows an embodiment of rising edge skew logic including a variable load pass-gate.

FIG. 6 schematically shows an embodiment of the rising edge skew logic 212 including a variable load pass-gate 602. Components of the rising edge skew logic 212 may be substantially the same as those shown in FIG. 3 and are identified in the same way and are described no further. The pass-gate 602 is a network of pass transistors (i.e., switches) that can be used to provide a delay-step size that is smaller than any one of the plurality of buffers 314. The pass-gate 602 may be used to provide additional intermediate (e.g., ½ step) delay to the clock input signal 302 that is output from the output line 310 to make the granularity of clock skew control finer.

The rising edge logic may include an additional delay signal (ADDITIONAL$_{13}$DELAY) 608 that is used activate the pass-gate 602 in order to adjust the additional delay applied to the output line 310. The additional delay signal 608 is sent to a latch 606. The latch 606 is configured to receive the additional delay signal 608, setup the additional delay signal 608 before the clock input signal 302 rises, and hold the additional delay signal 608 until the clock input signal 302 falls. By latching the additional delay signal through the transition of the clock input signal, the clock output signal 330 may be made glitchless. The additional delay signal 608 is used to control the pass-gate 602 to vary an amount of load 604 that is applied to node N at the output line 310 of the multiplexer 306. In some implementations, the load 604 is a gate and/or wire loading. The addition of the load 604 to node N via activation of the pass-gate 602 causes the signal on output line 310 to rise later (e.g., a few picoseconds later). In other words, when the load 604 is applied to node N the rising edge of the clock input signal 302 is delayed beyond an amount of delay that is output from the multiplexer 306.

This configuration is shown in the rising edge skew logic merely for illustration purposes, and it should be appreciated that the pass-gate and corresponding programmable load could be added to other nodes of the clock shaping circuit 210 to increase the delay control granularity. For example, the programmable load could be added to the falling edge skew logic to add a finer granularity delay to the falling edge.

Figure 7:
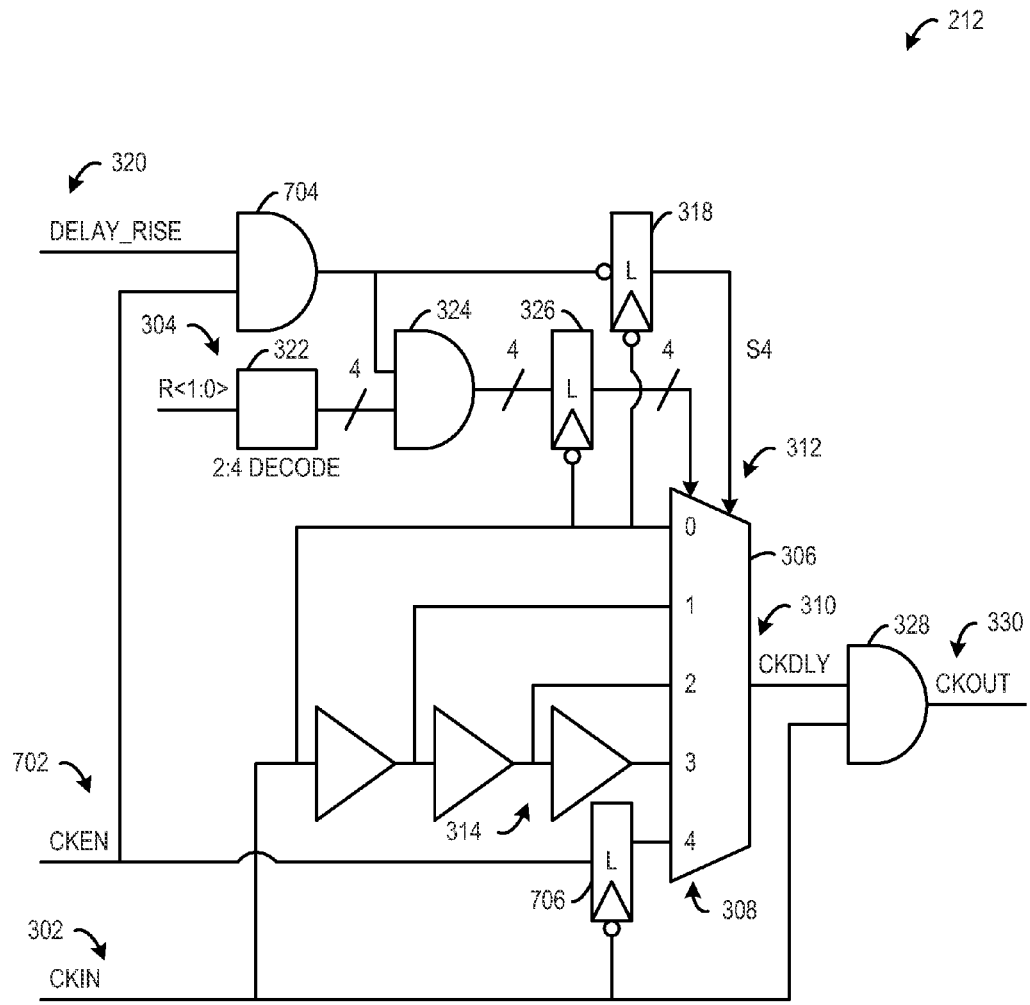
FIG. 7 schematically shows another embodiment of a rising edge skew logic that is configured to perform clock gating.

FIG. 7 schematically shows another embodiment of the rising edge skew logic 212 that is configured to perform clock gating. Components of the rising edge skew logic 212 may be substantially the same as those shown in FIG. 3 and are identified in the same way and are described no further. The rising edge skew logic 212 includes a clock enable signal (CKEN) 702 that selectively disables/enables portions of the rising edge skew logic 212 so that various components (e.g., latches) do not have to switch states as frequently. By reducing the frequency that the components of the rising edge skew logic 212 switch states, power consumption of the rising edge skew logic 212 is reduced.

The rising edge skew logic 212 includes an AND gate 704 that is coupled to an input of the latch 318. The AND gate 704 is configured to receive the delay rise enable signal 320 and the clock enable signal 702. The AND gate 704 causes the delay rise enable signal 320 to enable activation of the multiplexer 306 only when the clock enable signal 702 is enabled (e.g., rises).

Furthermore, the rising edge skew logic 212 includes a latch 706 that is coupled to one of the plurality of input lines 308 of the multiplexer 306. The latch 706 is configured to receive the clock enable signal 702. The latched version of the clock enable signal 702 replaces the power supply (e.g., VDD) connection, so that the clock input signal 302 is passed without delay only when the latched version is selected by the clock delay signal 304 and the clock enable signal 702 is enabled (e.g., rises).

This configuration is shown in the rising edge skew logic merely for illustration purposes, and it should be appreciated that the clock gating could be added to other portions of the clock shaping circuit 210 to reduce power consumption. For example, the clock gating configuration could be added to the falling edge skew logic for a greater reduction in power consumption.

Figure 8:
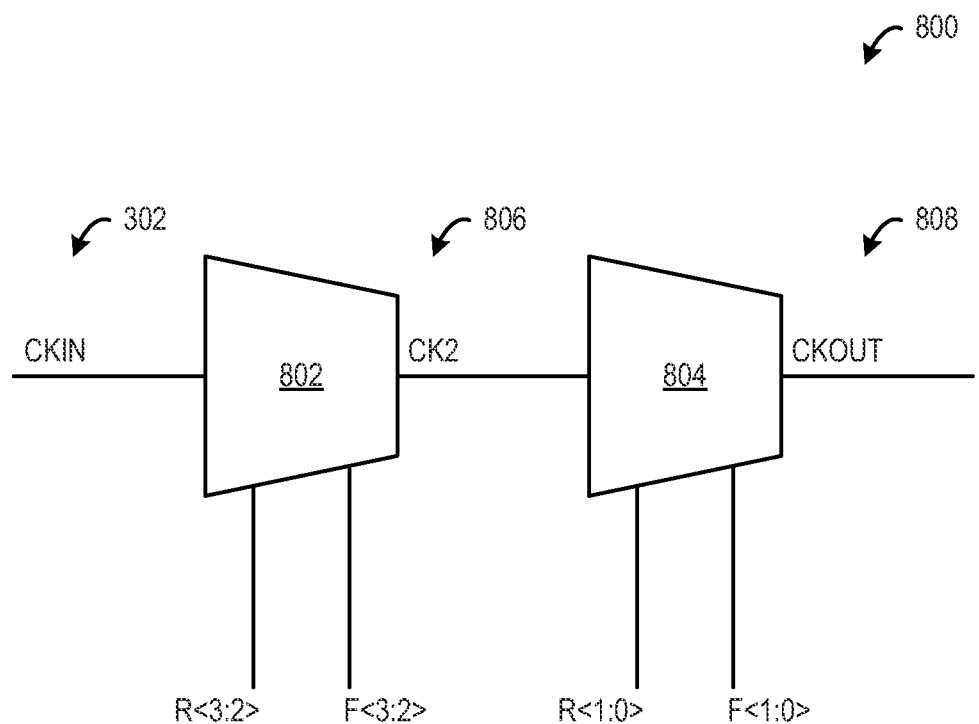
FIG. 8 schematically shows a plurality of clock shaping circuits in cascade.

FIG. 8 schematically shows a plurality of clock shaping circuits 800 in cascade. The plurality of clock shaping circuits 800 each may be the same or similar to the clock shaping circuit 210 shown in FIG. 4. The plurality of clock shaping circuits 800 may achieve a wider range of skewing capability and/or a larger number of steps for finer granularity relative to a single clock shaping circuit. The cascaded clock shaping circuits may provide a more robust configuration relative to cascading together additional multiplexers that may increase the likelihood of causing glitches or utilizing a larger multiplexer with additional select lines that may generate more noise.

In the illustrated embodiment, two clock shaping circuits are shown cascaded together, although it will be appreciated that more than two clock shaping circuits can be cascaded together to achieve any suitable range of skewing capability without departing from the scope of the present disclosure.

A first clock shaping circuit 802 is configured to receive the clock input signal 302. The first clock shaping circuit 802 is configured to output a clock output signal 806 that is selectively skewed relative to the clock input signal 302 such that the rising edge includes an amount of rise delay, the falling edge includes an amount of fall delay, or the rising edge includes an amount of rise delay and the falling edge includes an amount of fall delay.

A second clock shaping circuit 804 is cascaded with the first clock shaping circuit 802. The second clock shaping circuit 804 is configured to selectively skew the clock output signal 806 relative to the clock input signal 302 by further increasing the amount of rise delay of the clock output signal, further increasing the amount of fall delay of the clock output signal, or further increasing the amount of rise delay of the clock output signal and further increasing the amount of fall delay of the clock output signal. The second clock shaping circuit 804 is configured to output a further delayed output signal 808 that is further skewed relative to the clock output signal 806.

In some embodiments, the first and second clock shaping circuits may have the same or a different amount of delay steps. In some embodiments, the first and second clock shaping circuit may have the same or different step sizes. For example, in the illustrated embodiment, the first clock shaping circuit 802 has four delay steps that each have a step size of forty picoseconds and the second clock shaping circuit 804 has for delay steps that each have a step size of twelve picoseconds.

Figure 9:
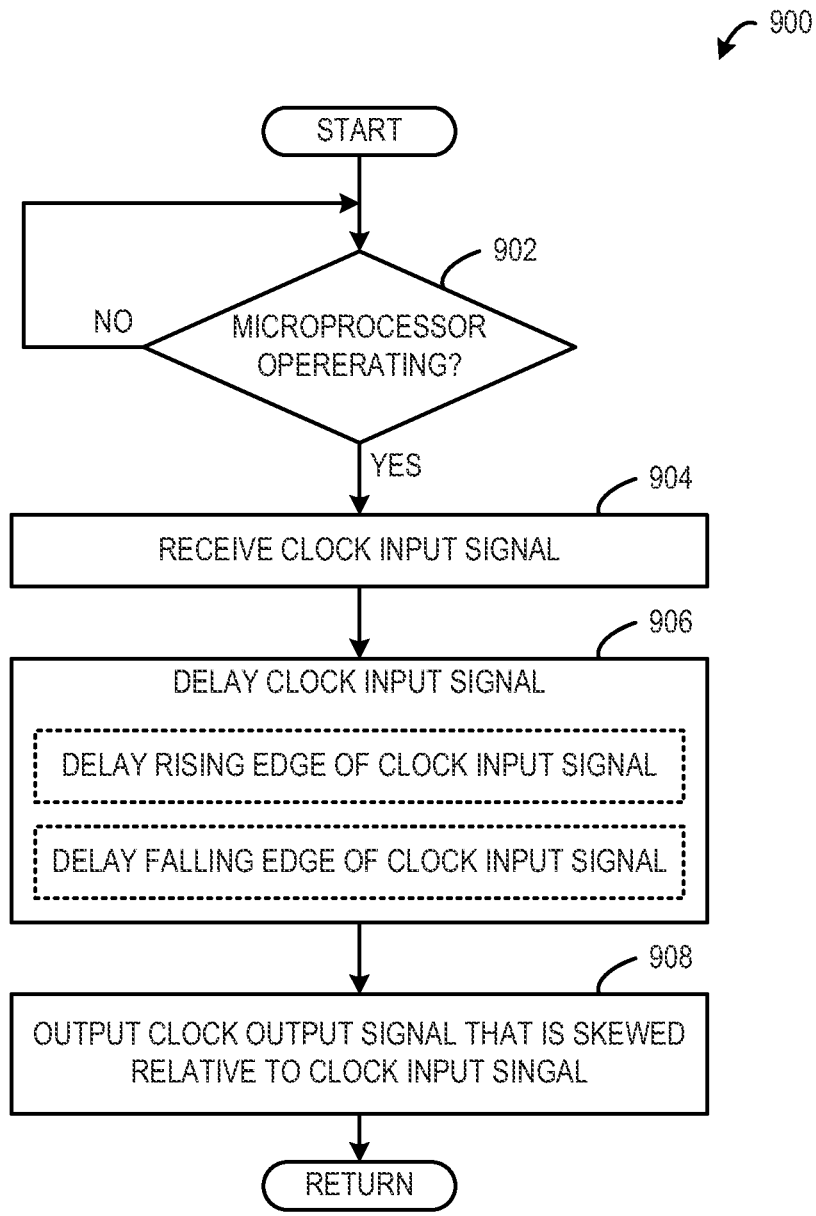
FIG. 9 shows an embodiment of a method for dynamically shaping a clock signal in a microprocessor.

FIG. 9 shows an embodiment of a method 900 for dynamically shaping a clock signal in a digital circuit. In one example, the method 900 may be implemented by the clock shaping circuit 210 of the microprocessor 202 shown in FIG. 2. However, it will be appreciated that the method 900 may be performed by the clock shaping circuit in any digital circuit that has a clock signal. At 902, the method 900 includes determining if the digital circuit is operating. If the digital circuit is operating, then the method 900 moves to 904. Otherwise, the method 900 returns to 902.

At 904, the method 900 includes, during operation of the digital circuit, receiving a clock input signal.

At 906, the method 900 includes delaying one or both of a rising edge and a falling edge of the clock input signal without stopping operation of the digital circuit. As discussed above, the clock input signal may be delayed based on a clock delay signal that determines whether the rising edge and/or the falling edge of the clock input signal should be delayed and by how much. In some cases, the rising edge is delayed and the falling edge is not delayed. In some cases, the falling edge is delayed and the rising edge is not delayed. In some cases, the falling edge is delayed and the rising edge is delayed. When the falling edge of the clock input signal is delayed it is delayed independent of adjustment of the rising edge. In other words, the falling edge is not necessarily delayed when the rising edge is delayed. Furthermore, in some cases the rising edge or the falling edge is delayed to adjust a duty cycle of the clock input signal. Under some operating conditions, the rising edge and the falling edge are not delayed or the delay for both edges is substantially zero. For example, two logic components may be already synchronized so that no skew adjustment is needed to match clock signal timing between the logic components.

In some embodiments, delaying is performed based on a clock delay signal that is latched before the clock input signal rises, and is held until the clock input signal falls. Accordingly, the clock input signal can be delayed without causing a glitch.

At 908, the method 900 includes outputting a clock output signal that is skewed relative to the clock input signal. The rising edge of the clock output signal may include an amount of rise delay, the falling edge of the clock output signal may include an amount of fall delay, or the rising edge may include an amount of rise delay and the falling edge may include an amount of fall delay based on the state of the clock delay signal. It will be appreciated that in some cases the amount of rise delay may be set to be substantially zero and the amount of fall delay may be set to be substantially zero. In other words, in some cases, the clock output signal may not be substantially skewed or delayed relative to the clock input signal as desired.

By dynamically adjusting the rising edge and the falling edge of the clock signal independently, the clock signal may be adjusted to accommodate operation completion times for different components in a computing system without slowing down the overall performance of the computing system. Moreover, since the clock signal is dynamically programmable, the clock signal can be advantageously adjusted post silicon production (i.e., post tape-out) to debug different components and accommodate different processing operations that may require more or less time to be completed than specified by design.

In the present description and the appended claims, the terms "first," "second," "third," etc. are used merely as labels, and are not intended to impose numerical or positional requirements on their objects. As used herein, an element or step recited in the singular and proceeded with the word "a" or "an" should be understood as not excluding plural of said elements or steps, unless such exclusion is explicitly stated. Furthermore, references to "one embodiment" of the invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A microprocessor comprising:
   one or more processing cores; and
   a clock shaping circuit within the one or more processing cores that is configured to receive a clock input signal, the clock shaping circuit including comprising:
      rising edge skew logic comprising a first plurality of buffers coupled in series, wherein the rising edge skew logic is configured to selectively delay a rising edge of the clock input signal; and falling edge skew logic comprising a second plurality of buffers coupled in series, wherein the falling edge skew logic is configured to selectively delay a falling edge of the clock input signal independent of the rising edge, wherein the clock shaping circuit is configured to output a clock output signal that is selectively skewed relative to the clock input signal such that a rising edge of the clock output signal includes an amount of rise delay, a falling edge of the clock output signal includes an amount of fall delay, or the rising edge of the clock output signal includes an amount of rise delay and the falling edge of the clock output signal includes an amount of fall delay.

2. The microprocessor of claim 1, wherein the clock input signal is skewed by the clock shaping circuit to match a clock insertion delay between processing cores.

3. The microprocessor of claim 1, wherein the rising edge skew logic of the clock shaping circuit is configured to dynamically vary an amount of rise delay, and wherein the falling edge skew logic is configured to dynamically vary an amount of fall delay.

4. The microprocessor of claim 2, wherein a respective buffer of the first plurality of buffers adds a delay step to a delay step of a previous buffer of the first plurality of buffers.

5. The microprocessor of claim 1,
wherein a first buffer of the first plurality of buffers is configured to receive the clock input signal,
wherein the rising edge skew logic further includes a first multiplexer comprising a first plurality of input lines, a first output line, and a first select line configured to select one of the first plurality of input lines to send to the first output line, wherein an output of each of the first plurality of buffers is coupled to one of the first plurality of input lines, and the first select line is configured to receive a first clock delay signal configured to select an amount of rise delay that is passed to the first output line,
wherein a first buffer of the second plurality of buffers is configured to receive the clock input signal, and
wherein the falling edge skew logic further includes a second multiplexer comprising a second plurality of input lines, second output line, and a second select line configured to select one of the second plurality of input lines to send to the second output line,
wherein an output of each of the plurality of second buffers is coupled to one of the second plurality of input lines, and the second select line is configured to receive a second clock delay signal configured to select an amount of fall delay that is passed to the second output line.

6. The microprocessor of claim 5,
wherein the first plurality of input lines comprise an input line coupled to a power supply, and if the clock delay signal indicates that the rising edge of the clock output signal is not to be delayed, the first select line is configured to select the input line coupled to the power supply; and
wherein the second plurality of input lines comprise an input line coupled to ground, and if the clock delay signal indicates that the falling edge of the clock output signal is not to be delayed, the second select line is configured to select the input line coupled to ground.

7. The microprocessor of claim 1, wherein the clock shaping circuit is a first clock shaping circuit and the one or more processing cores further comprises:
a second clock shaping circuit, cascaded with the first clock shaping circuit, that is configured to selectively skew the clock output signal relative to the clock input signal by further adding an additional amount of rise delay of the clock output signal, further adding an additional amount of fall delay of the clock output signal, or further adding an additional amount of rise delay of the clock output signal and further adding an additional amount of fall delay of the clock output signal.

8. The microprocessor of claim 7, wherein the second clock shaping circuit has a delay step size different from the first clock shaping circuit.

9. A method for dynamically shaping a clock input signal in a digital circuit, comprising:
during an operation of the digital circuit, receiving a clock input signal;
delaying one or both of a rising edge and a falling edge of the clock input signal without stopping the operation of the digital circuit, wherein the falling edge of the clock input signal is selectively delayed independent of adjustment of the rising edge thereof, wherein the delaying is performed based on a clock delay signal that is latched before the clock input signal rises, and is held until the clock input signal falls; and
outputting a clock output signal that is skewed relative to the clock input signal, such that a rising edge of the clock output signal includes an amount of rise delay, a falling edge of the clock output signal includes an amount of fall delay, or the rising edge includes an amount of rise delay and the falling edge includes an amount of fall delay.

10. The method of claim 9, wherein the clock output signal has a duty cycle different from the clock input signal.

11. The method of claim 9, wherein an amount of rise delay comprises an accumulation of a number of delays that are generated by a plurality of buffers coupled in series.

12. The method of claim 9, further comprising:
during an operating condition, setting an amount of rise delay to be substantially zero and an amount of fall delay to be substantially zero.

13. A clock shaping circuit configured to receive a clock input signal, comprising:
rising edge skew logic comprising a first plurality of buffers coupled in series, wherein the rising edge skew logic is configured to selectively delay a rising edge of the clock input signal; and
falling edge skew logic comprising a second plurality of buffers coupled in series, wherein the falling edge skew logic is configured to selectively delay a falling edge of the clock input signal independent of delaying the rising edge,
wherein the clock shaping circuit is configured to output a clock output signal that is selectively skewed relative to the clock input signal such that a rising edge of the clock output signal includes an amount of rise delay, a falling edge of the clock output signal includes an amount of fall delay, or the rising edge of the clock output signal includes an amount of rise delay and the falling edge of the clock output signal includes an amount of fall delay.

14. The clock shaping circuit of claim 13,
wherein the rising edge skew logic is configured to dynamically vary an amount of rise delay, and wherein the falling edge skew logic is configured to dynamically vary an amount of fall delay.

15. The clock shaping circuit of claim 14,
wherein a respective buffer of the first plurality of buffers adds a delay step to a delay step of a previous buffers of the first plurality of buffers.

16. The clock shaping circuit of claim 13,
wherein a first buffer of the first plurality of buffers is configured to receive the clock input signal, wherein the rising edge skew logic further comprises a first multiplexer comprising a first plurality of input lines, first output line, and a first select line configured to select one of the first plurality of input lines to send to the first output line, wherein an output of each of the first plurality of buffers is coupled to one of the first plurality of input lines, and the first select line is configured to receive a first clock delay signal configured to select an amount of rise delay that is passed to the first output line, wherein a first buffer of the second plurality of buffers is configured to receive the clock input signal; and wherein the falling edge skew logic further comprises a second multiplexer comprising a second plurality of input lines, second output line, and a second select line configured to select one of the second plurality of input lines to send to the second output line, wherein an output of each of the second plurality of buffers is coupled to one of the second plurality of input lines, and the second select line is configured to receive a second clock delay signal configured to select an amount of fall delay that is passed to the second output line.

17. The clock shaping circuit of claim 16, wherein the rising edge skew logic further comprise a first latch coupled to the first select line of the first multiplexer, wherein the first latch is configured to receive the first clock delay signal, set up the first clock delay signal before the clock input signal rises, and hold the first clock delay signal until the clock input signal falls, and wherein the falling edge skew logic further comprise a second latch coupled to the second select line of the second multiplexer, wherein the second latch is configured to receive the second clock delay signal, set up the second clock delay signal before the clock input signal falls, and hold the second clock delay signal until the clock input rises.

18. The clock shaping circuit of claim 17, wherein the rising edge skew logic further comprises:

a first AND gate coupled to an input of the first latch and configured to receive the first clock delay signal and a first clock enable signal; and a third latch coupled to one of he first plurality of input lines of the first multiplexer and configured to receive the first clock enable signal; and wherein the falling edge skew logic further comprises:

a second AND gate coupled to an input of the second latch and configured to receive the second clock delay signal and the second clock enable signal; and a fourth latch coupled to one of the second plurality of input lines of the second multiplexer and configured to receive the second clock enable signal.

19. The clock shaping circuit of claim 16, wherein the first plurality of input lines comprise an input line coupled to a power supply, and if the first clock delay signal indicates that the rising edge of the clock output signal is not to be delayed, the first select line is configured to select the input line coupled to the power supply; and wherein the second plurality of input lines comprise an input line coupled to ground, and if the second clock delay signal indicates that the falling edge of the clock output signal is not to be delayed, the second select line is configured to select the input line coupled to ground.

20. The clock shaping circuit of claim 16, wherein the rising edge logic further comprises a first pass-gate coupled to the first output line and configured to receive an additional delay signal that varies a load on the first pass-gate to selectively increase an amount of rise delay.

\* \* \* \* \*